United States Patent
Zhao et al.

(10) Patent No.: US 8,455,362 B2
(45) Date of Patent: Jun. 4, 2013

(54) CHEMICAL MECHANICAL POLISHING METHOD

(75) Inventors: Feng Zhao, Shanghai (CN); Wufeng Deng, Shanghai (CN); Jingmin Zhao, Shanghai (CN); Feng Chen, Shanghai (CN); Chunliang Liu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 51 days.

(21) Appl. No.: 13/253,947

(22) Filed: Oct. 5, 2011

(65) Prior Publication Data
US 2012/0244706 A1    Sep. 27, 2012

(30) Foreign Application Priority Data
Mar. 22, 2011    (CN) .......................... 2011 1 0068908

(51) Int. Cl.
*H01L 21/302*    (2006.01)
(52) U.S. Cl.
USPC .............. 438/692; 438/691; 438/693; 216/89

(58) Field of Classification Search
USPC ... 438/690, 691, 692, 693, 694, 695; 134/1.1, 134/1.2; 216/88, 89
See application file for complete search history.

(56) References Cited

U.S. PATENT DOCUMENTS

| | | | |
|---|---|---|---|
| 6,692,546 B2 * | 2/2004 | Ma et al. .......................... | 51/298 |
| 2002/0042193 A1 * | 4/2002 | Noguchi et al. .............. | 438/618 |
| 2003/0114000 A1 * | 6/2003 | Noguchi ....................... | 438/687 |

FOREIGN PATENT DOCUMENTS
CN    101376232 A    3/2009

* cited by examiner

*Primary Examiner* — Lan Vinh
(74) *Attorney, Agent, or Firm* — Anova Law Group, PLLC

(57) ABSTRACT

A chemical mechanical polishing method includes providing a device layer having a surface to be polished, polishing the surface using an alkaline grinding slurry, removing a residual layer that is been formed on the polished surface using an acid buffer, forming a passivation layer covering the polished surface of the device layer after the residual layer has been removed, and cleaning the passivation layer using deionized water. A semiconductor device thus fabricated has surfaces with excellent flatness, good manufacturing yield and long-term reliability.

8 Claims, 4 Drawing Sheets

CHEMICAL MECHANICAL POLISHING METHOD

CROSS-REFERENCES TO RELATED APPLICATIONS

The present application claims the priority of Chinese Patent Application No. 201110068908.2, entitled "CHEMICAL MECHANICAL POLISHING METHOD", and filed on Mar. 22, 2011, the entire disclosure of which is incorporated herein by reference.

FIELD OF THE INVENTION

The present invention generally relates to a chemical mechanical polishing process in semiconductor technology, and more particularly, to chemical mechanical polishing method capable of providing good surface planarity.

BACKGROUND OF THE INVENTION

In semiconductor industry, fabrication of semiconductor devices requires deposition of multilayer thin films. When the multilayer thin films are deposited, with an increase in the number of the layers, a high degree of surface planarity is necessary because any surface unevenness or imperfection will be gradually magnified, which affects the manufacturing yield and long-term reliability of the semiconductor devices. Thus, a planarization process is performed on each thin film layer of the semiconductor devices so that each thin film of the semiconductor devices may have a flat surface.

Since 1980s, Chemical Mechanical Polishing (CMP) processes have been used in the semiconductor industry. The CMP process may solve the problem caused by the unevenness of each thin film layer surface of the semiconductor devices generated by the combined effect of chemical grinding and mechanical grinding.

A conventional CMP process is performed on a semiconductor device as follows:

Referring to FIG. 1, a device layer 105 including a metal layer 103 and an insulating layer 101 is provided, the device layer 105 having a surface that is grinded by using an acid grinding slurry 110. While the layer 105 is being grinded, benzotriazole (BTA) is added to prevent the layer 105 from being oxidized. After grinding the polishing layer 105 is finished, a residual layer 111 is formed on the surface of the device layer 105, which includes a metallic oxide and/or metallic hydroxide 107, a BTA 109 and the grinding slurry 110 adhering to a surface of the metallic oxide and/or metallic hydroxide 107.

Referring to FIG. 2, the residual layer 111 is removed by deionized water.

However, while the residual layer 111 is being removed by the deionized water, a part of the metallic oxide and/or metallic hydroxide 107, and the BTA 109 adhering to the surface of the metallic oxide/hydroxide 107 and the like are difficult to be removed. These remaining residues greatly affect the manufacturing yield and long-term reliability of the semiconductor devices.

Accordingly, the device layer may have an uneven surface due to the metallic oxide, metallic hydroxide that are left on the surface of the device layer, and corrosion inhibitor adhering to the surface of the metallic oxide, metallic hydroxide. Therefore, there is a need to provide a CMP method that is capable to remove the residues and provide a flat surface of the device layer to increase the manufacturing yield and long-term reliability of the semiconductor device.

BRIEF SUMMARY OF THE INVENTION

Embodiments of the present invention provide a CMP method that increases the manufacturing yield and long-term reliability of a semiconductor device. The method includes providing a device having a surface to be polished, polishing the surface using an alkaline grinding slurry, removing a residual layer that is formed on the layer after the surface has been polished using an acid buffer, and forming a passivation layer covering the polished surface of the device layer after the removal of the residual layer.

Optionally, the acid buffer includes at least one organic acid compound.

Optionally, the organic acid compound may be ethylenediaminetetraacetic acid, polycarboxylic acid, or hydroxycarboxylic acid.

Optionally, the device layer includes at least a metal layer.

Optionally, the metal layer is made of one of Cu, W or Al.

Optionally, the alkaline grinding slurry includes silica particles and an alkaline $H_2O_2$ solution.

Optionally, the residual layer may be metallic oxide, metallic hydroxide, metallic oxide silicide, or a combination thereof.

Optionally, the method further includes cleaning the passivation layer using deionized water.

Embodiment of the invention have many advantages over the conventional techniques as described below.

In the embodiment of the present invention, the acid buffer is added to remove the residual layer after the grinding. Under an acidic condition, water-fast materials like metal oxide, metal hydroxide, metal oxide silicide and the like in the residual layer can release metal ions which have large solubility in the deionized water, therefore the residual layer may be likely to be removed.

Additionally, the passivation layer being formed on the surface of the polished surface of the device layer after the removal of the residual layer may effectively prevent the polished surface of the device layer from being oxidized.

Furthermore, the organic acid compound has relatively weak acidity and may not corrode the polished surface of the device layer. The polished surface of the device layer has excellent planarity. Therefore, the semiconductor device has high manufacturing yield and good long-term reliability.

DETAILED DESCRIPTION OF THE INVENTION

Inventors of the present invention have found that, in the conventional method, BTA is added into the grinding process. The BTA may adhere to the surfaces of metallic oxide and/or metallic hydroxide, which is difficult to be removed. Additionally, the conventional method uses an acid grinding slurry to grind the device layer, which may likely corrodes the surface to be polished and cause an uneven surface of the polished layer.

Furthermore, inventors have found that, under an acidic condition, bonds between metal atoms and oxygen atoms in the metallic oxide and/or metallic hydroxide may be broken and so that metal ions are generated. The metal ions have relatively high solubility in a cleaning solution and can be easily removed. Additionally, it has been found that the formation of a passivation layer on the polished surface of the device layer after the metallic oxide/hydroxide have been removed can effectively prevent metal in the polished layer from being oxidized.

Figure 1:
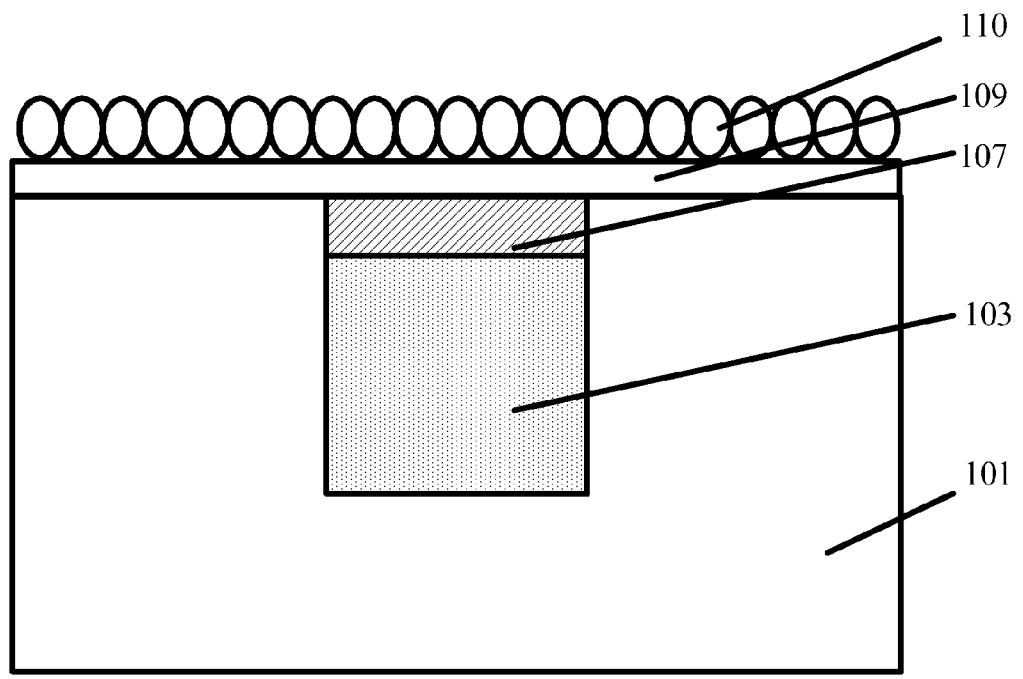
FIGS. 1-2 are schematic cross-sectional views of intermediate structures illustrating a CMP method, as known in prior art.
Figure 2:
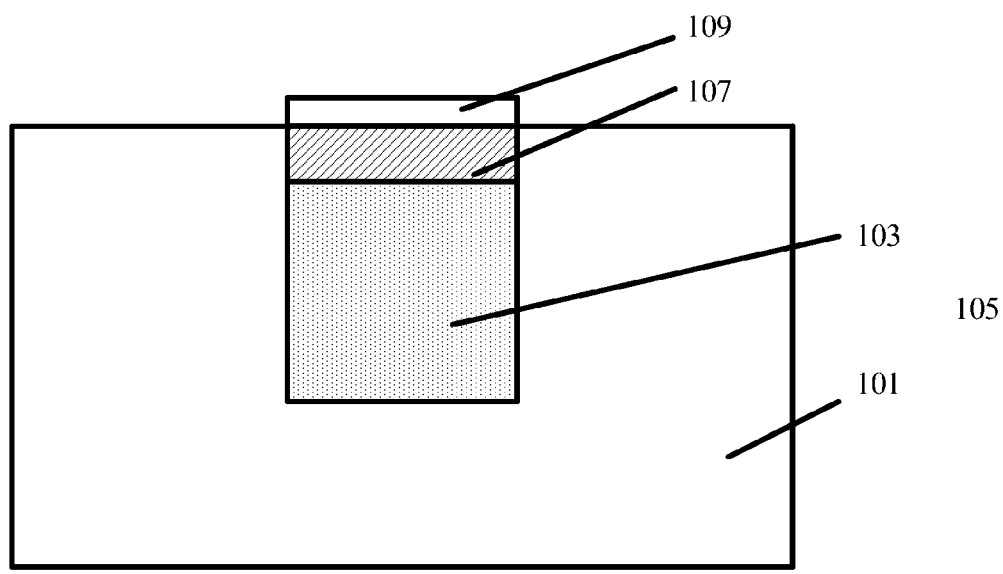
Figure 3:
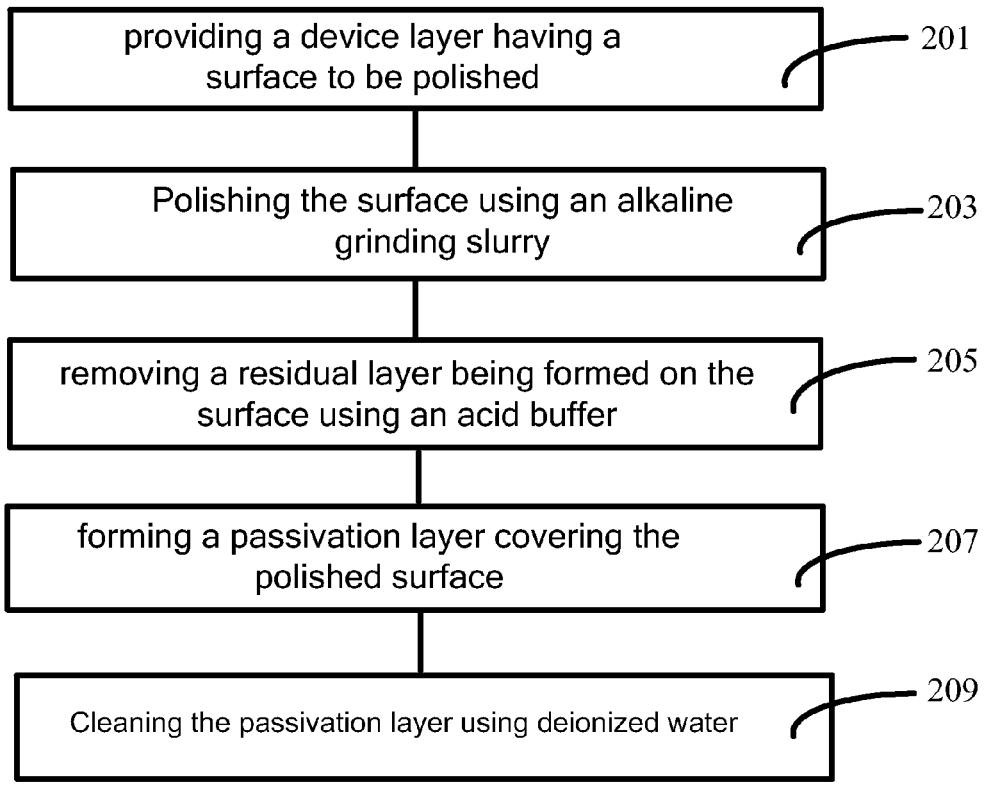
FIG. 3 is a flow chart illustrating a CMP method according to an embodiment of the present invention.

FIG. 3 is a flow chart illustrating a CMP method according to an embodiment of the present invention. The CMP method includes:

providing a device layer having a surface to be polished (step 201);

polishing the surface using an alkaline grinding slurry (step 203);

removing a residual layer which is formed on the polished layer after the grinding process by using an acid buffer (step 205);

forming a passivation layer covering the polished layer after the removal of the residual (step 207); and cleaning the passivation layer using deionized water (step 209).

By using the method provided by the embodiment of the present invention, the residual layer is likely to be completely removed, the polished surface of the device layer may have excellent planarity, and the semiconductor device thus fabricated by the method may have good manufacturing yield and long-term reliability.

When illustrating the embodiments of the present invention, the schematic cross-sectional drawings are provided for illustrative purposes only and, as such, they are not drawn to scale. Further, the cross-sectional drawings serve to explain the principles of the embodiments of the invention, and shouldn't be limiting the scope of the invention. Further, dimensions such as length, width and depth in three-dimensional space should be comprised in practical fabrication.

Figure 4:
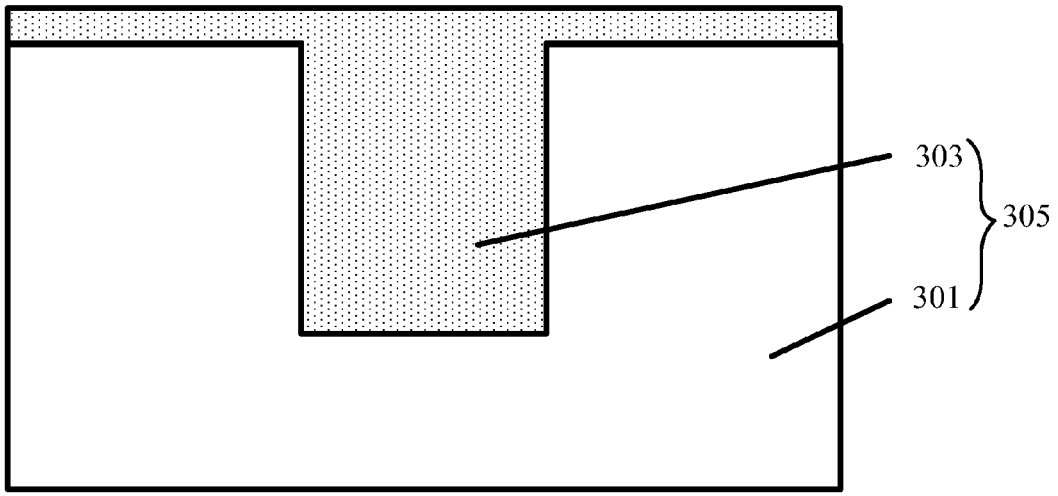
FIGS. 4-7 are schematic cross-sectional views of intermediate structures illustrating a CMP method according to an embodiment of the present invention.
Figure 5:
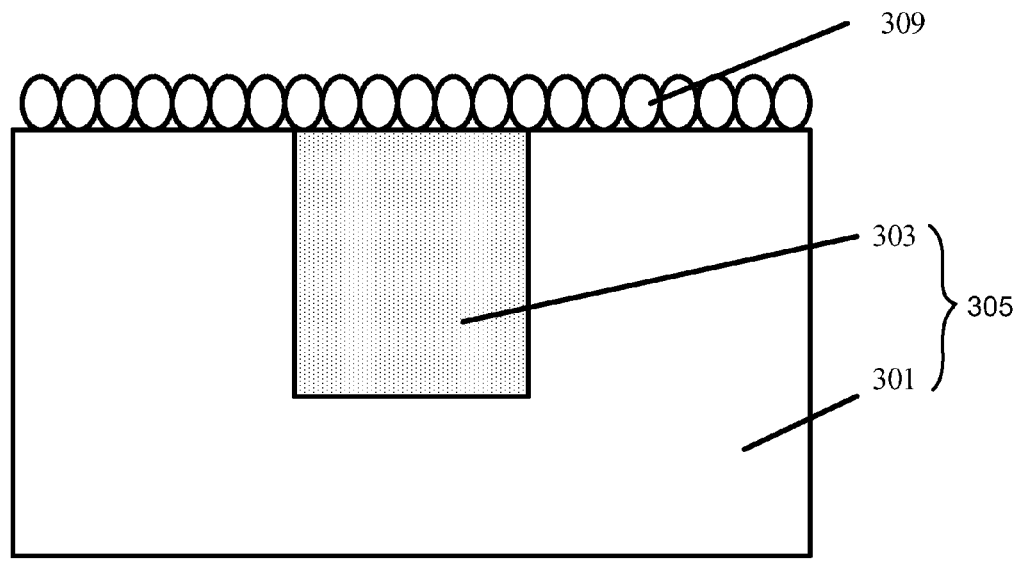
Figure 6:
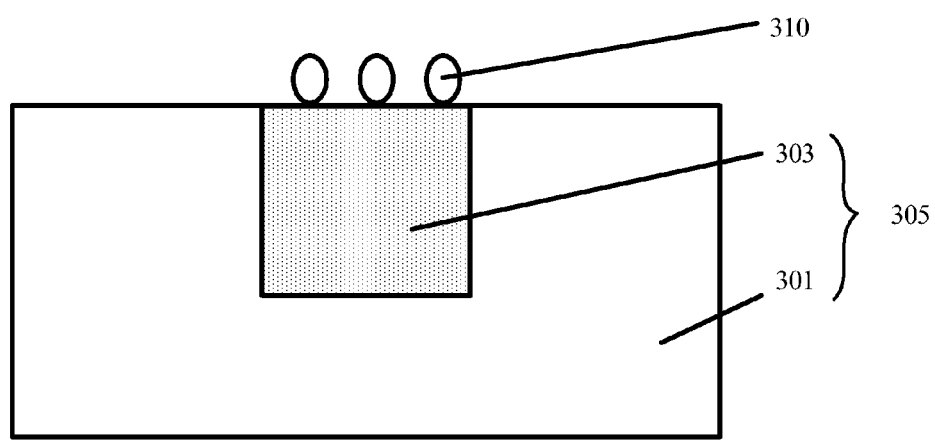

FIGS. 4-6 are cross-sectional views of intermediate structures illustrating a chemical mechanical polishing method according to the embodiment of the present invention.

Referring to FIGS. 3 and 4, step 201 is performed to provide a device layer 305 having a surface to be polished.

The device layer 305 may include an insulating layer 301 having a trench and a metal layer 303 covering the insulating layer 301 including the trench.

The insulating layer 301, which is used for insulating active devices, is made of oxide or nitride, such as silicon oxide, silicon nitride and the like. The insulating layer 301 may be formed by a deposition process such as a physical vapor deposition or chemical vapor deposition process. The deposition processes are well known in the art and will not be described herein.

In an embodiment, the metal layer 303 is made of one of copper (Cu), tungsten (W), or aluminum (Al), and may be used for forming gate electrodes or conductive plugs, and the like. The metal layer 303 may be formed by a deposition process such as a physical vapor deposition process or chemical vapor deposition process. In an embodiment, the device layer 305 includes copper and silicon oxide. Processes for forming the device layer 305 includes depositing silicon oxide to form insulating layer 305 by a chemical vapor deposition process, then forming a photoresist layer (not shown in the figures) covering the insulating layer 301, wherein the photoresist layer has openings with corresponding locations on the insulating layer 301 which is used for forming trenches, etching the insulating layer 301 by using the photoresist layer as a mask to form the trenches (not shown in the figures), and filling Cu into the trenches to form the metal layer 303.

As a result of using the deposition process to form the device layer 305, the device layer 305 has an uneven surface that needs to be planarized. Chemical mechanical polishing process is performed in subsequent steps to remove parts of the metal layer 303, in order that the metal layer 303 is substantially flush (coplanar) with the insulating layer 301.

Referring to FIGS. 3 and 5, step 203 is performed to grind the device layer 305 with an alkaline grinding slurry 309.

The grinding slurry 309 includes grinding particles and a grinding solution. The grinding particles are silica particles and the grinding solution is an alkaline hydrogen peroxide ($H_2O_2$) solution.

The grinding solution is used to create chemical reactions with materials on the surface of the device layer 305, which produces substances that need to be removed. Thereafter, through the mechanical effect, the grinding particles remove the substances that need to be removed, thereby greatly accelerating the chemical mechanical polishing.

In a specific embodiment, under an alkaline condition, a thin layer of metal on the surface of the metal layer 303 is firstly oxidized into metallic oxide and metallic hydroxide adhering to the metal by the alkaline $H_2O_2$ solution in the grinding slurry 309. Additionally, while grinding, some of the silica particles react with the metallic oxide and the metallic hydroxide so that a metallic oxide silicide is generated. Then, by the effect of mechanical grinding, the silica particles remove the metallic oxide, the metallic hydroxide and the metallic oxide silicide adhering to the surface of the metal.

In an embodiment of the present invention, the alkaline $H_2O_2$ solution first reacts with the Cu to oxidize the thin layer of Cu on the surface of the metal layer 303 into CuO and $Cu(OH)_x$ (x=1 or 2). And parts of the silica particles react with the CuO and the $Cu(OH)_x$ (x=1 or 2), producing Cu—O—Si. Then, by the effect of mechanical grinding, the CuO and the $Cu(OH)_x$ (x=1 or 2) adhering to the surface of the metal are removed by the silica particles.

Referring to FIGS. 3 and 6, step 205 is performed to remove a residual layer 310 formed on the surface of the polishing layer after grinding by using an acid buffer.

After the completion of the grinding step, parts of the metal oxide, the metal hydroxide and the metal oxide silicide formed by the oxidation of the alkaline $H_2O_2$ solution that haven't been removed by the grinding particles may adhere to the surface of the polishing layer 305 to form the residual layer 310.

The residual layer 310 includes at least one of the metal oxide, the metal hydroxide and the metal oxide silicide.

In the conventional techniques, deionized water is normally used to remove the residual layer 310. However, inventors of the present invention have discovered that the metal oxide, the metal hydroxide and the metal oxide silicide have relatively low solubility in the deionized water and are thus difficult to be removed, which causes an uneven polished surface of the device layer 305 and affects the manufacturing yield and long-term reliability of the semiconductor device.

An embodiment of the present invention uses the buffer that is an acid solution, hydrogen ions contained therein react with the residual layer 310, and thus bonds between metal atoms and oxygen atoms of the metallic oxide, the metallic hydroxide and the metallic oxide in the residual layer 310 are broken, thereby releasing metal ions which have high solubility in the cleaning solution of subsequent cleaning steps and making the residual layer 310 relatively easy to be removed.

In order to avoid corrosion of the surface of the device layer 305 and damages in its planarization, the buffer is made of weak acids. In an embodiment, the buffer includes at least one organic acid compound, such as ethylenediaminetetraacetic acid, polycarboxylic acid, hydroxycarboxylic acid, or a combination thereof. The organic acid compounds have relatively weak acidity, which can remove the residual layer 310. And it may not corrode the surface of the device layer 305 by the organic acid compounds. Thus, the surface of the polishing layer 305 may have excellent planariztion and the semiconductor device may have good reliability.

It should be noted that, when the residual layer 310 is removed by using the acid buffer, the acid buffer is only dripped on the surface of the residual layer 310 to react with the residual layer 310. After the buffer is dripped on the surface of the residual layer 310, for removing the residual layer 310 thoroughly and not corroding the surface of the device layer 305, the buffer is used to remove the residual layer 310 in a time period of about 5 seconds to about 20 seconds.

In an embodiment, after the grinding step, a layer of CuO, Cu(OH)x (x=1 or 2) and Cu—O—Si that has not been removed by the grinding particles may still adhere to the surface of the metal layer. So the residual layer 310 includes CuO, Cu(OH)x (x=1 or 2) and Cu—O—Si.

The buffer is ethylenediaminetetraacetic acid, which is dripped on a surface of the residual layer 310 for 10 seconds, hydrogen ions contained in the ethylenediaminetetraacetic acid react with the CuO, Cu(OH)x (x=1 or 2) and Cu—O—Si in the residual layer 310, thus the bonds between the Cu atoms and the oxygen atoms are broken and Cu+ and/or Cu2+ are generated. The Cu+ and/or Cu2+ have high solubility in the subsequent cleaning solution and can easily be removed.

It should be noted that the residual layer 310 is removed by having a reaction between the buffer and the residual layer 310, which generates substances that can easily dissolve in subsequent steps. In some embodiments, some Cu+ and/or Cu2+ together with a layer of the grinding slurry (not shown in the figures) may still be adhered to the surface of the device layer to protect the polished layer 305.

Figure 7:
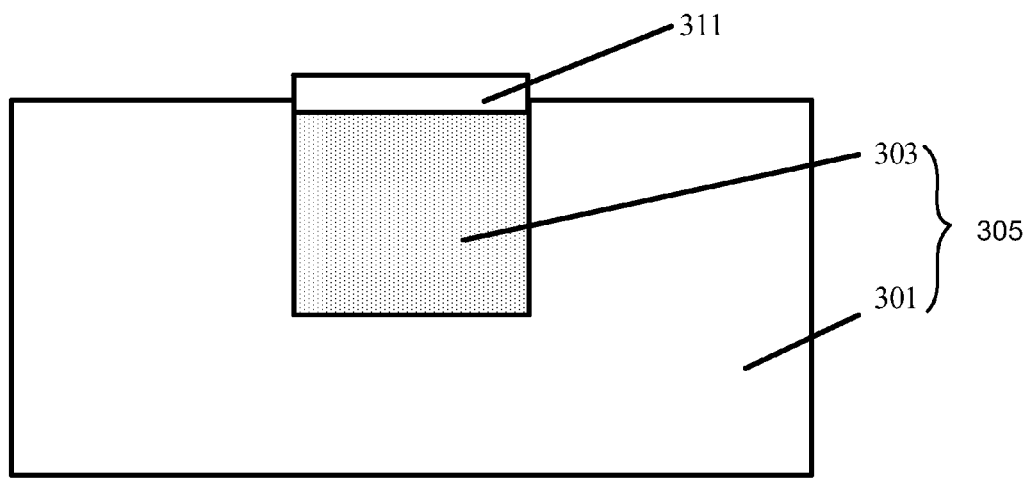

Referring to FIGS. 3 and 7, step 207 is performed to form a passivation layer 311 covering the polished layer 305 after the removal of the residual layer.

The passivation layer 311 is formed on the polished layer 305 to protect the polished layer 305 from being oxidized. Processes for forming the passivation layer 311 may include adding a corrosion inhibitor, such as benzotriazole (BTA), on the surface of the polished layer 305, after the removal of the residual layer. Because the corrosion inhibitor does not adhere to the surface of the metal oxide and/or metal hydroxide but to the metal surface of the polished layer, the corrosion inhibitor reacts with a thin layer of metal on the surface of the polished device layer and passivates the thin layer of metal to form a thin layer of the passivation layer 311 to prevent a further oxidation of the polished device layer 305.

It should be noted that, after the passivation layer 311 is formed on the surface of the polishing layer 305, some metal ions and a layer of the grinding slurry left may still adhere to the surface of the passivation layer 311.

In an embodiment, the corrosion inhibitor adheres to the surface of the metal Cu and reacts with the metal Cu, which forms a thin layer of Cu-BTA. The Cu-BTA is complex. The Cu-BTA adheres to the surface of the metal Cu and may stop the oxidation thereof. In an embodiment, the passivation layer 311 is a thin layer of Cu-BTA covering on a surface of a Cu metal layer 303. There may be some Cu+ and/or Cu2+ together with a layer of the grinding slurry left over adhere to the surface of the passivation layer 311.

Because there may be some metal ions and a layer of the grinding slurry left over on the surface of the passivation layer 311, after the passivation layer 311 is formed, a cleaning step is performed on the surface thereof.

Deionized water is used to clean the passivation layer 311. Because a semiconductor device may have relatively high requirements on the surfaces of each thin film, deionized water with relatively high purity is used to avoid bringing in new impurities. During the cleaning process, the metal ions and grinding slurry on the surface of the passivation layer 311 are cleaned up in the deionized water, and the passivation layer 311 is exposed, in order to prevent the oxidation of the metal layer 303, which is beneficial for forming the semiconductor device subsequently.

In an embodiment, Cu+ and/or Cu2+ produced in the chemical mechanical polishing process adhere to the surface of the passivation layer 311. Because Cu+ and/or Cu2+ are very soluble in water, the Cu+ and/or Cu2+ together with the grinding slurry are very likely to be cleaned away when using the deionized water to clean. After the aforesaid steps are finished, the chemical mechanical polishing according to an embodiment of the present invention is completed.

In conclusion, embodiment of the present invention provide the following advantages, features and benefits:

An acid buffer is added to remove the residual layer after the polishing layer is grinded. Under an acid condition, water-fast materials such as metal oxide, metal hydroxide, metal oxide silicide and the like in the residual layer may release metal ions which may be easily dissolved in the deionized water, therefore the residual layer may be easily removed.

A passivation layer is formed on the surface of the polished layer after the acid buffer is added to remove the residual layer. The passivation layer can effectively prevent the polished layer from being oxidized.

Furthermore, the organic acid compounds are weak acids and may not corrode the polished surface of the device layer. The polished surface of the device layer may have excellent flatness, the semiconductor device thus fabricated may have good manufacturing yield and long-term reliability.

Although the present invention has been disclosed above with reference to preferred embodiment thereof, it should be understood that the invention is presented by way of example only, and is not limiting. Those skilled in the art can modify and vary the embodiments without departing from the spirit and scope of the present invention.

What is claimed is:

1. A chemical mechanical polishing method, comprising:
    providing a device layer having a surface to be polished;
    polishing the surface of the device layer using an alkaline grinding slurry to form a residual layer
    removing the residual layer formed on the polished surface of the device layer using an acid buffer immediately after the surface of the device layer is polished; and
    forming a passivation layer covering the polished surface of the device layer after the removing of the residual layer.

2. The method according to claim 1, wherein the acid buffer comprises a least one organic acid compound.

3. The method according to claim 2, wherein the at least one organic acid compound is ethylenediaminetetraacetic acid, polycarboxylic acid or hydroxycarboxylic acid.

4. The method according to claim 1, wherein the device layer comprises a metal layer.

5. The method according to claim 4, wherein the metal layer comprises copper (Cu), tungsten (W), or aluminum (Al).

6. The method according to claim 1, wherein the alkaline grinding slurry comprises silica particles and an alkaline $H_2O_2$ solution.

7. The method according to claim 1, wherein the residual layer comprises metal oxide, metal hydroxide, metal oxide silicide, or a combination thereof.

8. The method according to claim further comprising cleaning the passivation layer using deionzed water.

* * * * *